(12) United States Patent
Lin

(10) Patent No.: US 6,960,938 B2
(45) Date of Patent: Nov. 1, 2005

(54) ENHANCED CMOS CIRCUIT TO DRIVE DC MOTORS

(75) Inventor: Wan-Jung Lin, Hsinchu (TW)

(73) Assignee: Avid Electronics Corp., Hsinchu (TW)

( * ) Notice: Subject to any disclaimer, the term of this patent is extended or adjusted under 35 U.S.C. 154(b) by 0 days.

(21) Appl. No.: 10/812,030

(22) Filed: Mar. 30, 2004

(65) Prior Publication Data

US 2005/0206409 A1 Sep. 22, 2005

(51) Int. Cl.[7] .................................... H03K 19/0175
(52) U.S. Cl. ......................... 326/83; 326/82; 326/81
(58) Field of Search .............................. 326/68, 80, 81, 326/82, 83, 112, 119, 121; 327/108, 109, 327/112

(56) References Cited

U.S. PATENT DOCUMENTS 5,414,379 A * 5/1995 Kwon ........................ 327/170
5,568,081 A * 10/1996 Lui et al. .................... 327/380

* cited by examiner

Primary Examiner—Anh Q. Tran
(74) Attorney, Agent, or Firm—Hershkovitz & Associates; Abe Hershkovitz

(57) ABSTRACT

An enhanced CMOS circuit to drive a DC motor is disclosed, in which a CMOS circuit is used to form a driver circuit of the DC motor, replacing a conventional BiCMOS for the part of the driver circuit, which is used in a portable CD player. Two switching stages are each formed by four CMOS transistors connected in series, with one end of the circuit being connected to a positive power supply with a higher voltage and another end connected to ground or negative power supply terminal. The switching stages are able to produce high output voltages, which are applied on the gates of the CMOS transistors in the driver stage to lower the driving impedance of the conduction channel and to produce sufficient output current to drive a DC motor.

9 Claims, 10 Drawing Sheets

ENHANCED CMOS CIRCUIT TO DRIVE DC MOTORS

BACKGROUND OF THE INVENTION

1. Field of the Invention

The present invention is related to using an enhanced CMOS circuit to form a driver circuit of a DC motor, and more particularly to an enhanced CMOS circuit that is able to boost current gain, replacing the BiCMOS circuit for the part of the driver circuit, in order to produce sufficient output current to drive a DC motor of a portable CD player. Also, the present invention enables the combination of different control circuits to be formed on the same chip using an MOS process with lower production costs.

2. Description of Related Art

A BiCMOS circuit contains both bipolar junction transistors and CMOS transistors, allowing for advantages of both processes to be exploited. Bipolar circuits are inherently faster than the CMOS, and have shorter signal delay and faster switching speed, making them suitable for high frequency applications such as operation amplifiers, but CMOS circuits are preferred where low power dissipation and high packing densities are required such as for microprocessors and memory ICs. However, the production costs of hybrid BiCMOS circuits are higher than those for CMOS circuits. For those applications that do not require high frequency and fast switching speed, the CMOS circuits are more frequently used.

But conventional CMOS transistors have their own limitations. The small output current, due to the inherent driving impedance, is insufficient to drive a DC motor or other digital motors. To solve that problem, a number of alternatives are to be described below.

1. Increasing the channel width of CMOS: generally a CMOS channel width is about 6,000 um. If the channel width is increased to 16,000 um, the driving impedance ($R_{on}$) through the conduction channel of CMOS transistors can be lowered to boost current gain across the CMOS transistors, thus the output current can be increased. Using this method will increase the size of the integrated circuit, which is contrary to current efforts to downsize components.

2. Increasing the gate-to-source voltage ($V_{GS}$) of CMOS: if the gate-to-source voltage ($V_{GS}$) of CMOS is increased, driving impedance through the conduction channel of CMOS can be lowered to boost current gain, so output current will be increased. However, the CMOS generally exhibits low voltage endurance, thus it poses a challenge for circuit designers to maintain the operating voltage of CMOS circuits below 5V.

The input impedance of CMOS transistors is exceptionally high. Hence, using the conventional CMOS technology, output current cannot be effectively increased to meet the requirements of large current applications. To get around the problem, designers choose to use CMOS for the part of control circuit, and BiCMOS for the part of driver circuit. But then the combination of BiCMOS and CMOS transistors on the same chip requires much more complex processes.

SUMMARY OF THE INVENTION

The main object of the present invention is to provide an enhanced CMOS circuit that can form a driver circuit of DC motors, which are used in portable CD players. The enhanced CMOS circuit is capable of lowering the driving impedance of a CMOS conduction channel and boosting current gain so as to produce sufficient output current to drive a DC motor.

The second object of the invention is to provide a CMOS driver circuit that enables the combination of control circuits and driver circuits to be formed on the same chip using a MOS fabrication process, thus the production costs will be reduced.

To this end, the present enhanced CMOS circuit to form a driver circuit of DC motors comprises a pair of switching stages and one driver stage.

The two switching stages are each formed by a pair of PMOS transistors, connected in series, and a pair of NMOS transistors, connected in series to form a push-pull circuit, wherein one end is connected to a positive power supply terminal with a higher voltage, whilst another end is connected to ground or to a negative power supply terminal; the node connecting the pair of PMOS transistors and the pair of NMOS transistors acts as an output of the switching stage; one of each of the two PMOS transistors and two NMOS transistors are switch transistors to receive control signals; the other PMOS transistor and NMOS transistor are load transistors with the gate electrodes respectively connected to power sources with different control voltages;

whereby the first and second switching stages are controlled by input signals of the logic control circuits in a way to produce complementary signals.

The driver stage is formed by a pair of NMOS transistors connected in series, wherein the node connecting the NMOS transistors acts as an output to a load (that is, the DC motor); the gate of one of the two NMOS transistors is controlled by output signals of one switching stage, and the gate of the other NMOS transistor is controlled by complementary signals from another switching stage.

According to the present invention, the above mentioned driver circuit is entirely formed by CMOS transistors. This enables the combination of the driver circuit and control circuit on the same chip, using the MOS process alone without the Bi-MOS process, thus the production costs of the circuits can be reduced.

According to the present invention, one end of each of the first and second switching stages formed by multiple CMOS transistors is connected to a positive power supply terminal with higher voltage, which will lead to high gate-to-source voltage ($V_{GS}$) over the NMOS transistors of the driver stage. As resistance of the conduction channel is controlled by the voltage applied on the gate, the high controlling voltage being applied on the gate electrode is able to lower driving impedance ($R_{on}$) through the conduction channel of the NMOS transistor and produce sufficient output current to drive a DC motor.

In the above mentioned two switching stages, the gate electrode of one of the two PMOS transistors is connected to a first DC power supply with 1.5–4 V, whilst the gate electrode of one of the two NMOS transistors is connected to a second DC power supply with 4.5 V, such that the gate electrodes of the PMOS and NMOS transistors are to receive pulse signals with predetermined control voltages.

In the above mentioned two switching stages, the predetermined control voltage (1.5–4V) of the first DC power supply being applied on the gate electrode of PMOS transistor (12) of the switching stage (10) and on one end of the driver circuit is drawn from a battery (BAT), whilst the predetermined control voltage (4.5V) of the second DC power supply being applied on the gate electrode of NMOS transistor (13) of the switching stage (10) is derived from the system voltage.

The above two switching stages and the driver stage are parallelly connected across a power supply, with one end of the switching stage being connected to the positive power supply terminal with higher voltage, equal to the summation of output voltages of the first DC power supply and the second DC power supply, and another end of the two switching stages being connected to ground or negative power supply terminal. In such condition, it is possible to apply high output voltage of the two switching stages over the gate of the NMOS transistor in the driver stage in order to boost the gate-to-source voltage ($V_{GS}$) of the NMOS transistor, which results in lower driving impedance ($R_{on}$) through the conduction channel of NMOS transistor and greater current gain across the transistors.

According to the invention, since the second DC power supply is derived from the operating voltage of the system, the output voltage of the switching stage can be maintained at a relatively high level, and is not affected by eventual flattening of the output voltage of the first DC power supply.

Other objectives, advantages and novel features of the invention will become more apparent from the following detailed description when taken in conjunction with the accompanying drawings.

DETAILED DESCRIPTION OF THE PREFERRED EMBODIMENT

Figure 1:
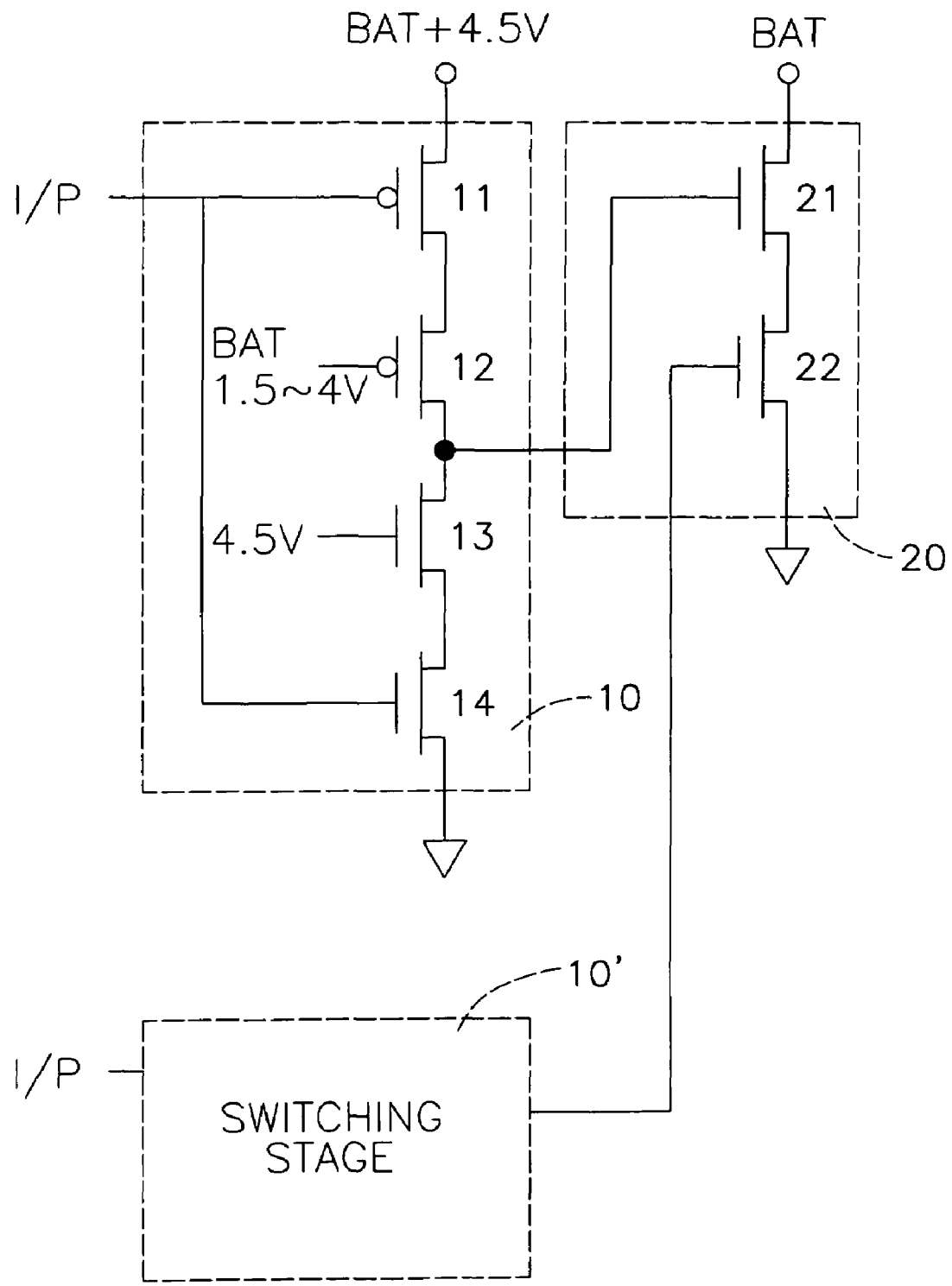
FIG. 1 is a block diagram of the driver circuit of the present invention.
Figure 2A:
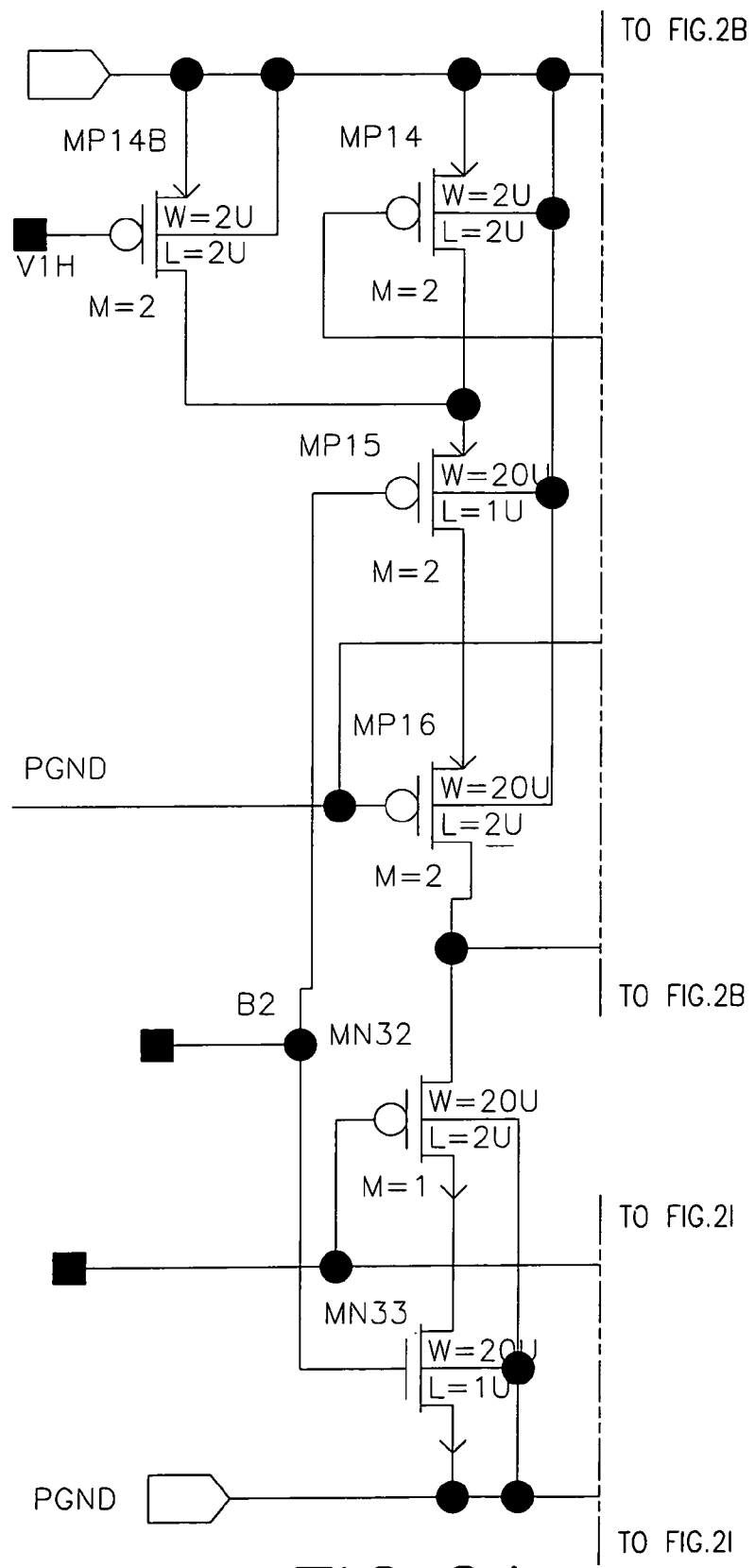
FIGS. 2A–2I is a circuit diagram of the actual implementation of the present invention on a driver circuit of the DC motor.
Figure 2B:
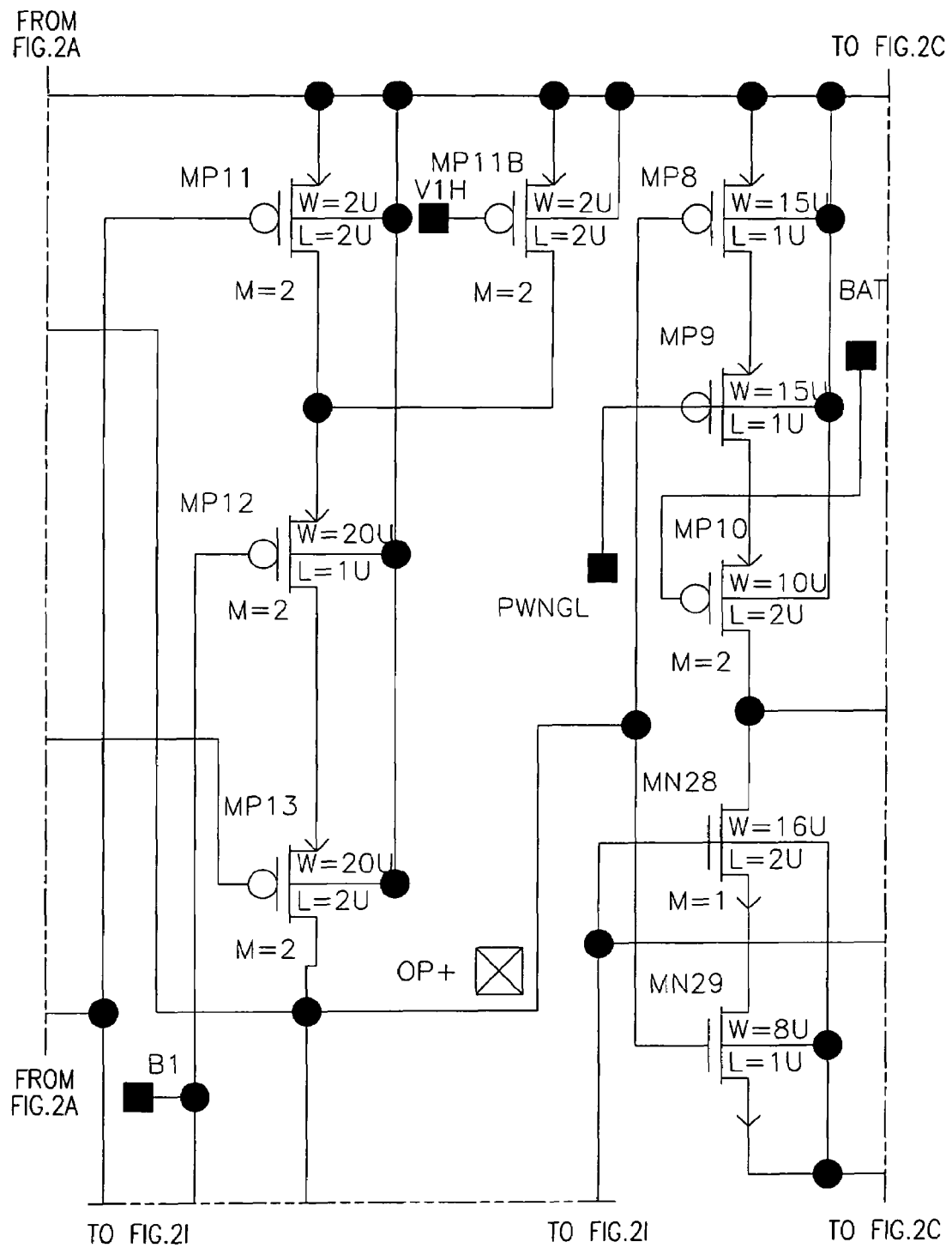
Figure 2C:
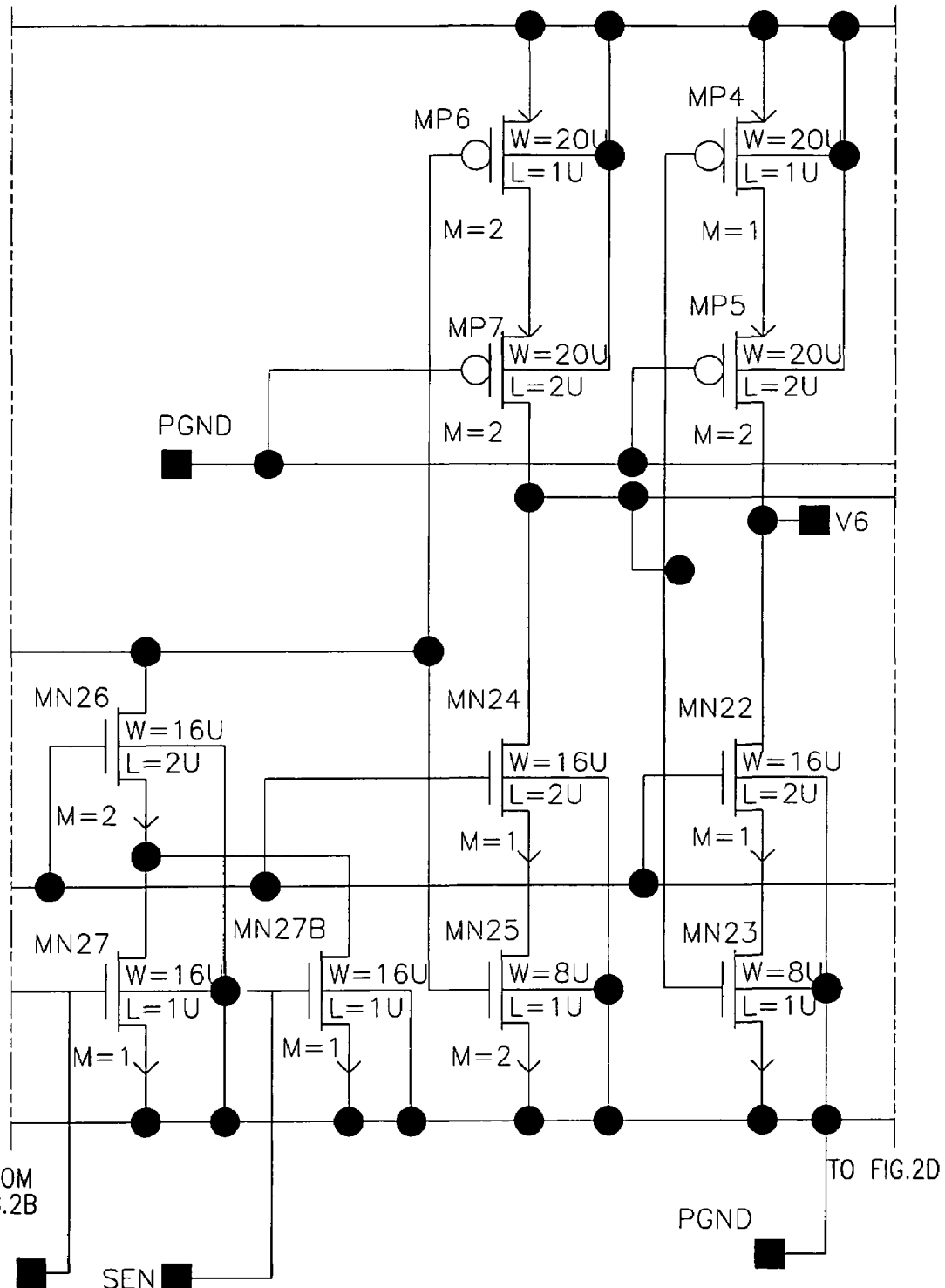
Figure 2D:
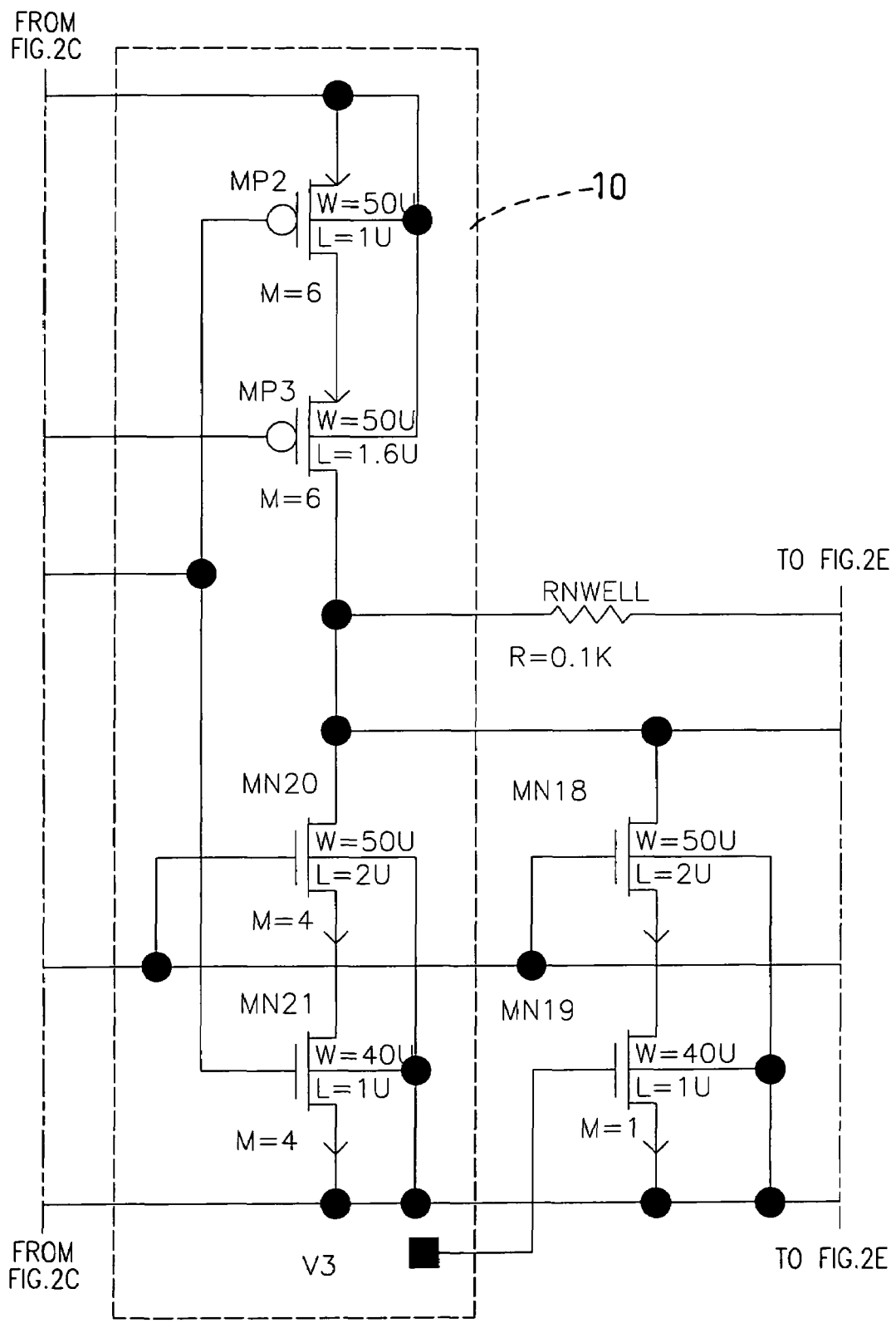
Figure 2E:
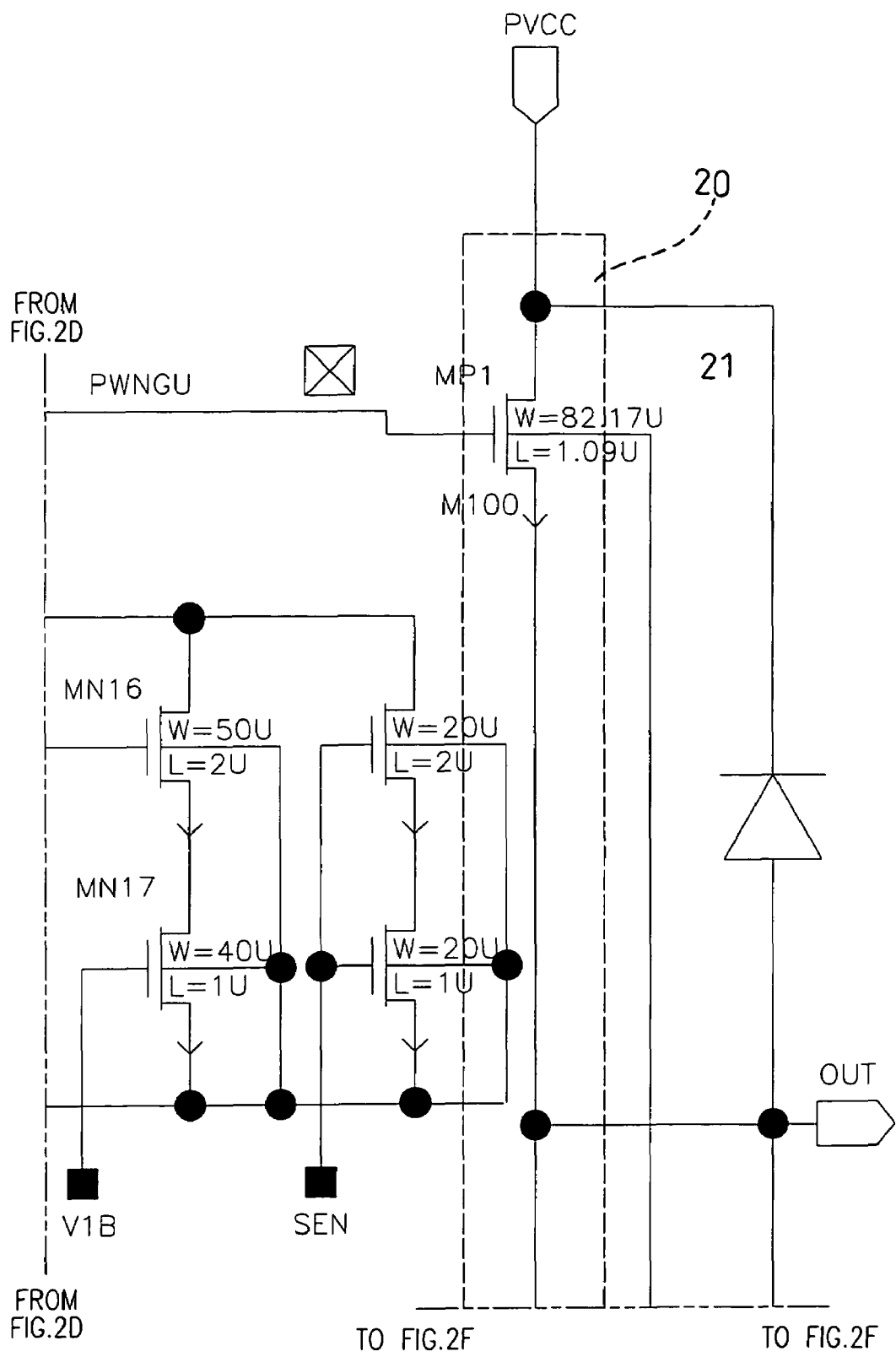
Figure 2F:
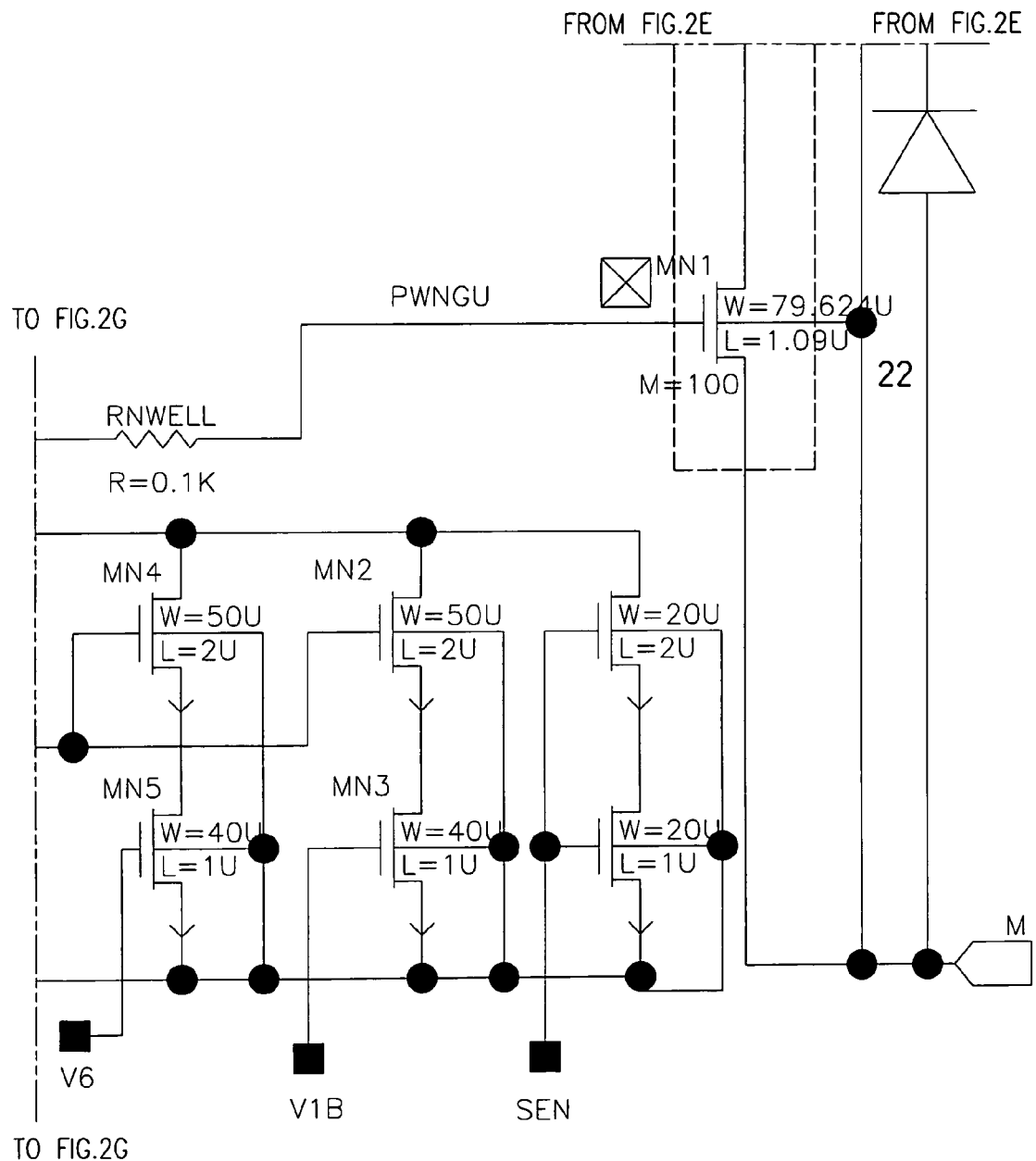
Figure 2G:
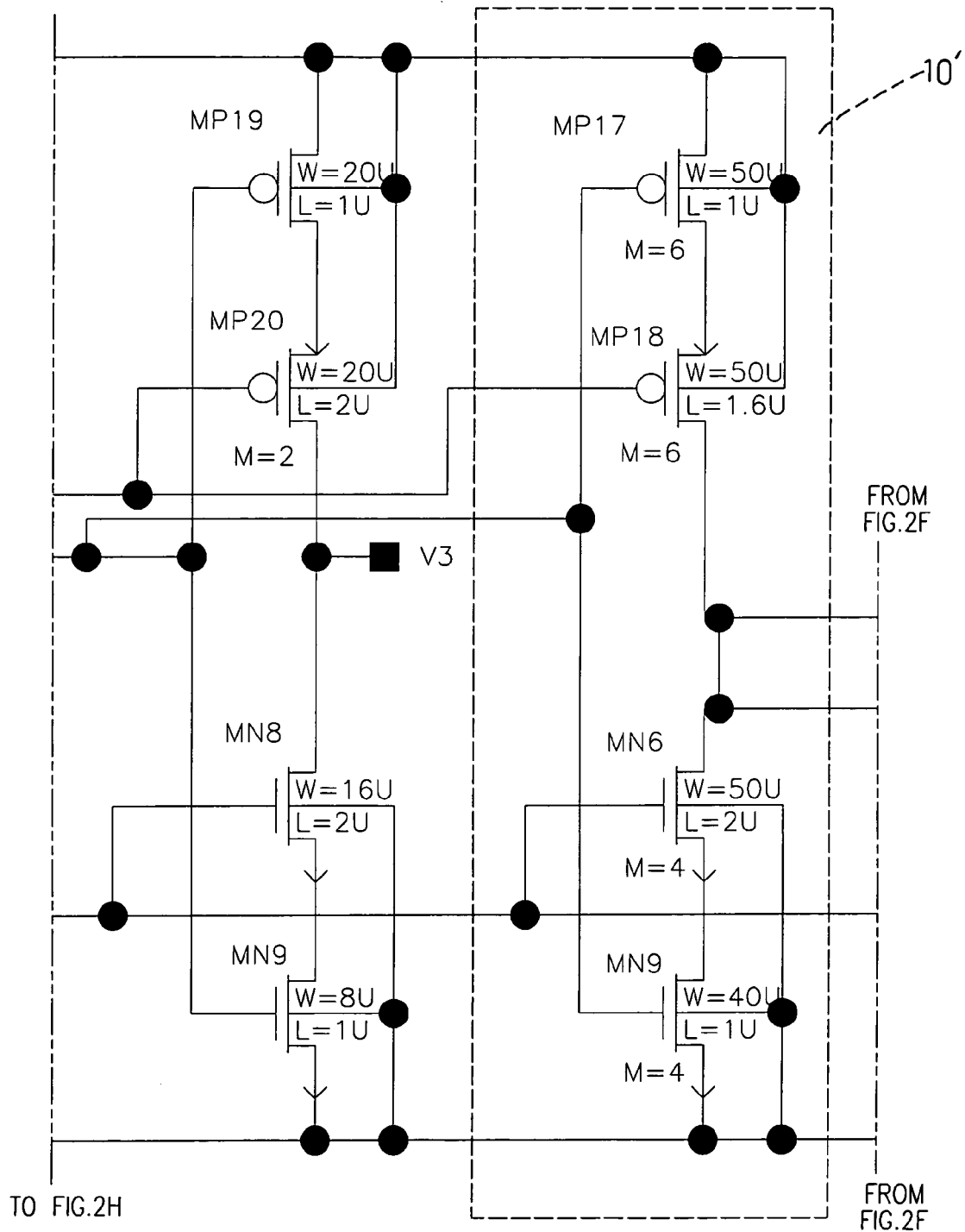
Figure 2H:
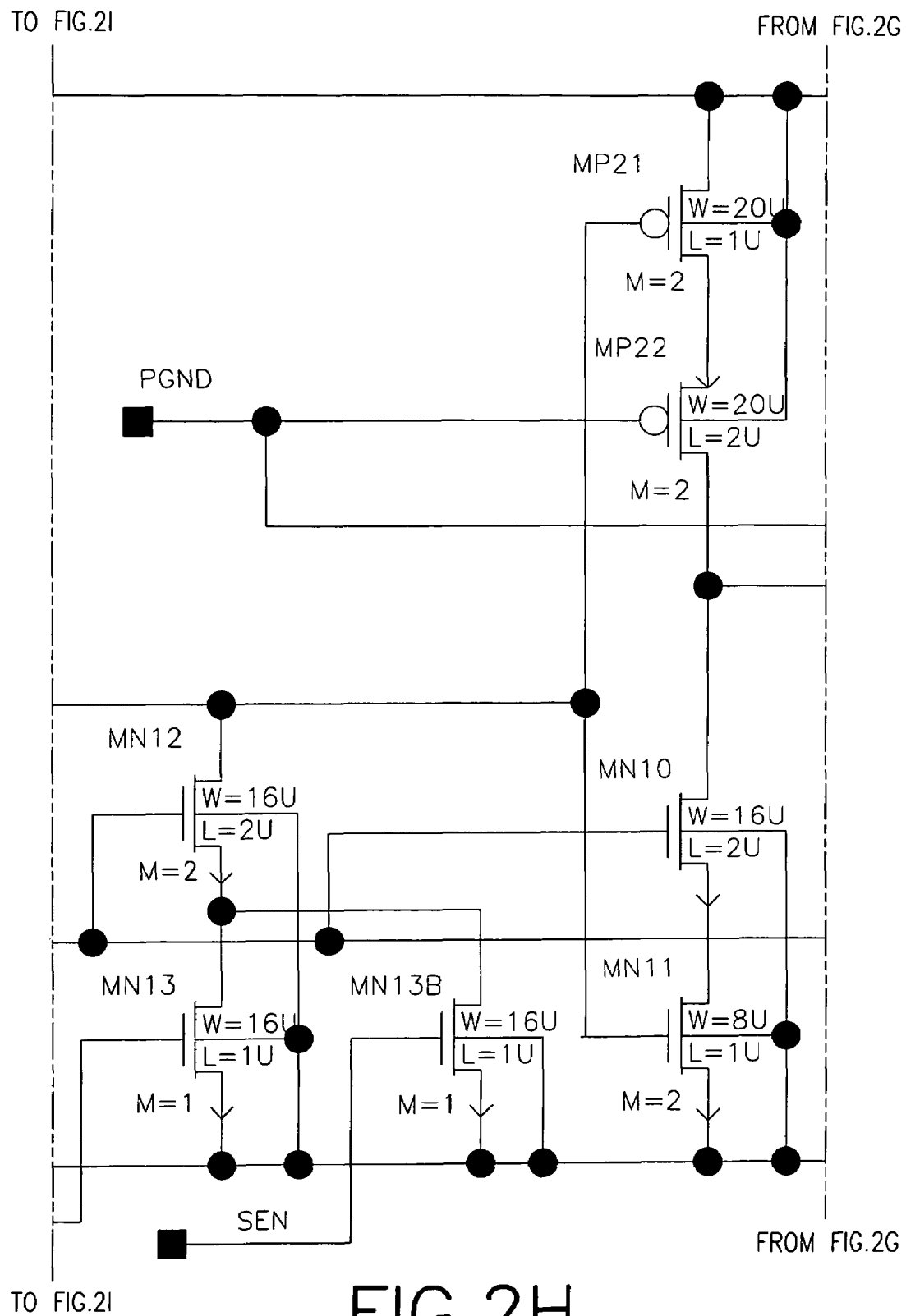
Figure 2I:
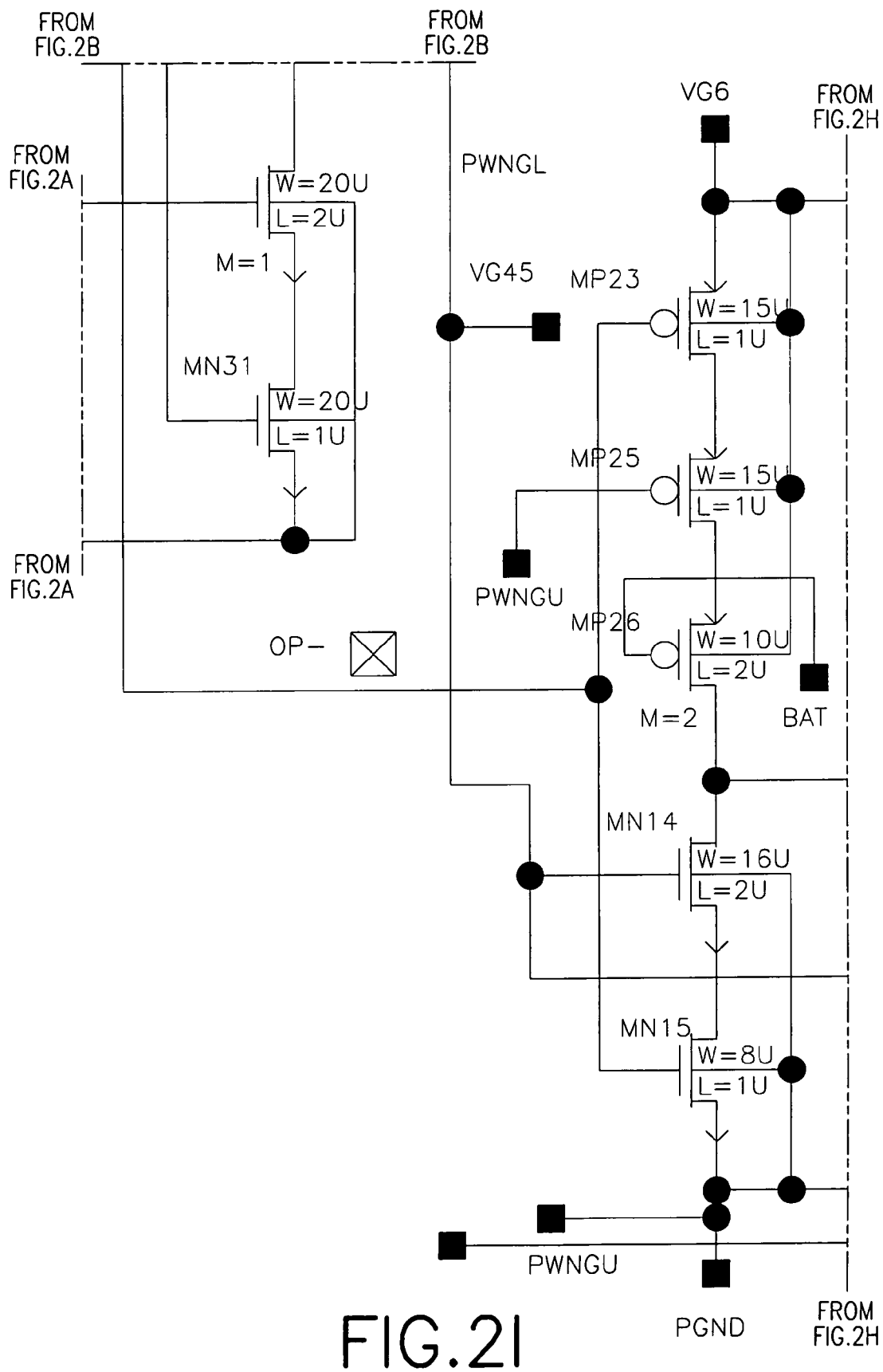

The driver circuit of a DC motor used in a portable CD player is shown in FIG. 1, comprising at least a first and a second switching stage (10) (10') (only the first switching stage (10) is shown in the diagram) and a driver stage (20).

The first switching stage (10) is formed by a pair of PMOS transistors (11) (12), connected in series, and a pair of NMOS transistors (13) (14), also connected in series, to form a push-pull circuit.

One end of the switching stage (10) is connected to a positive power supply terminal with a higher voltage, whilst another end is connected to ground or to negative power supply terminal. In the present example, the supply voltage of the positive power supply terminal is the summation of output voltages of the first DC power supply (1.5–4 V) and the second DC power supply (4.5 V).

The node connecting the pair of PMOS transistors (11) (12) and the pair of NMOS transistors (13) (14) acts as output of the switching stage (10). One of the two PMOS transistors (11) and one of the two NMOS transistors (14) are tied together to share common input signals, and the gate electrodes of the other PMOS transistor (12) and NMOS transistor (13) are respectively connected to power sources with different control voltages to receive gating signals.

The second switching stage (10') has the same quantity of PMOS and NMOS transistors and the same circuit structure, that means one of the two PMOS transistors (11') and one of the two NMOS transistors (14') are tied together, and the gate electrodes of the other PMOS transistor (12') and NMOS transistor (13') are respectively connected to power sources with different control voltages.

The first and second switching stages (10) (10') are controlled by input signals in a way to produce complementary signals to control the operation of the driver stage.

In the present example, the gate of the PMOS transistor (12) is connected to a first DC power supply (1.5–4 V), and the gate of NMOS transistor (13) is connected to a second DC power supply (4.5 V), such that the pair of PMOS/ NMOS pairs (11) (12)/(13) (14) forms a voltage divider, whilst individual PMOS/NMOS transistors (11) (12) (13) and (14) are still able to operate with 5V.

The gate electrode of PMOS transistor (12) is connected to the first DC power supply (1.5–4V) and the gate electrode of NMOS transistor (13) is connected to a second DC power supply (4.5), wherein the power source for the first DC power supply comes from the battery (BAT) of the CD player, (output voltage of two batteries series connected); and the second DC power supply is derived from the system voltage.

When the PMOS transistors (11) (12) are turned on, the output voltage of the switching stage (10) will reach a high of 4.5V+BAT. Even though the supply voltage of the battery (BAT) will eventually flatten out, the output voltage of the switching stage (10) will be maintained at 4.5V+.

The driver stage (20) is formed by two NMOS transistors (21) (22) connected in series, wherein the node connecting two NMOS transistors (21) (22) acts as output to a DC motor (M); one NMOS transistor (21) is to receive gating signals from the first switching stage (10); the other NMOS transistor (22) is to receive complementary signals from the second switching stage (10'); and one end of the driver stage (20) is connected to the first DC power supply terminal, and another end is connected to ground or negative power supply terminal.

For the purpose of the present illustration, only the NMOS transistor (21) of the driver stage (20) is described here, but the description is equally applicable to the NMOS transistor (22) of the driver stage (20). Since the output voltage of first switching stage (10) reaches as high as 4.5V+BAT, that means, gate-to-source voltage ($V_{GS}$) of NMOS transistor (21) will also be increased. Hence, the driving impedance ($R_{on}$) of NMOS transistor (21) can be lowered to generate sufficient current for driving a DC motor. The operations of the NMOS transistors (21) (22) are respectively controlled by output signals of the two switching stages (10) (10') to provide inversion of an AND logic function on the output.

Also, one end of the first and second switching stages (10) (10') is connected to the positive power supply terminal with higher voltage, in which the supply voltage is equal to the summation of output voltages of the first DC power supply (1.5–4V) and the second DC power supply (4.5 V).

Since portable CD players are powered by battery (BAT), the present invention is able to employ the battery, which is the first DC power supply, to boost the output voltage of the switching stages (10) (10'), and as a current source ($V_{CC}$) for the two stages of the driver circuit.

The trigger voltage of CMOS transistors will not be affected by eventual flattening of the output voltage through the first DC power supply due to power dissipation. Even though the supply voltage of the first DC power supply (BAT) will eventually be flattened over a certain time, the second DC power supply will be maintained at a high level, thus the gate-to-source voltage ($V_{GS}$) over the NMOS transistors of driver stage can be maintained at relatively high level.

In FIGS. 2A–2I, a detailed circuit diagram of the driver circuit of DC motor is formed using the present invention, in which the first and second switching stages (10) (10') are respectively connected to the gates of the two NMOS transistors (21) (22) of the driver stage (20) through a resistor, and the output of the driver stage (20) is connected to a DC motor (not shown in diagram).

In the above driver circuit, the first switching stage (10) is formed by a PMOS transistor pair (MP2, MP3) and a NMOS transistor pair (MN16, MN17), whilst the second switching stage (10') is formed by a PMOS transistor pair (MP17, MP18) and an NMOS pair (MN20, MN21), in which the PMOS transistors (MP2, MP17) and NMOS transistors (MN17, MN21) are to receive input signals from the preceding stage; the PMOS transistors (MP3, MP18) are respectively connected to PGND with control voltage (1.5–4V), and NMOS transistors MN16, MN20 are connected to VG45 with control voltage (4.5V).

Using the above circuit design, the CMOS driver circuit is able to produce sufficient output current to drive a DC motor in a portable CD player, without having to use BiCMOS transistors. Accordingly, the control circuit and the driver circuit can be formed on the same chip using a MOS fabrication process, thus the production costs can be lowered and the circuit design will be simplified.

In the aspect of electrical characteristics, since one end of the first and second switching stages is connected to a positive power supply terminal with higher voltage, the output voltages of the two switching stages can be effectively boosted to charge the gate electrodes of the NMOS transistors of the driver stage to a high voltage level. Hence, the gate-to-source voltage ($V_{GS}$) over the NMOS transistors of driver stage can be raised to enable the reduction of driving impedance ($R_{on}$) through the conduction channel and greater current gain across the CMOS transistors to produce sufficient output current for a DC motor.

Having the problems of low voltage endurance and high input impedance associated with conventional CMOS transistors, under control, the present invention is able to form a driver circuit, without using BiCMOS transistors for the part of driver circuit, that is able to drive DC motor of a battery-powered portable CD player. In the driver circuit, two switching stages and a driver stage are employed, where each switching stage is formed by four CMOS transistors connected in series, with one end of the circuit being connected to a positive power supply with a higher voltage and another end being connected to ground or negative power supply terminal. The switching stages are able to produce high output voltages, which are applied on the gates of the CMOS transistors in the driver stage to lower the driving impedance of the conduction channel and to produce sufficient output current to drive a DC motor.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An enhanced CMOS circuit to drive a DC motor used in a portable CD player, comprising:

a first and a second switching stage (10) (10'), wherein each switching stage is formed by a pair of PMOS transistors (11) (12) connected in series and a pair of NMOS transistors (13) (14) connected in series to form a push-pull circuit; wherein one end of each switching stage is connected to a positive power supply terminal with higher voltage, and another end is connected either to ground or negative power supply terminal; wherein a node connecting the pair of PMOS connectors (11) (12) and the pair of NMOS transistors (13) (14) acts as an output of the switching stages (10) (10'); wherein a gate electrode of one of the two PMOS transistors (11) and one of the two NMOS transistors (14) are tied together to share a common input signal; a gate of the other PMOS transistor (12) is connected to a first power source with a predetermined control voltage, and a gate of the other NMOS transistor (13) is connected to a second power source with a predetermined control voltage, to form a voltage divider, whereby individual transistors tolerate an operating voltage; and a driver stage (20) formed by two NMOS transistors (21) (22) connected in series; wherein a node connecting the two NMOS transistors (21) (22) is used as an output for connection to a DC motor (M); one of the two NMOS transistors (21) is to receive gating signals from the first switching stage (10); the other NMOS transistor (22) is to receive complementary signals from the second switching stage (10').

2. The enhanced CMOS circuit to drive a DC motor according to claim 1, wherein the predetermined control voltage being applied on the gate of the PMOS transistor (12), both in the first and second switching stages (10) (10'), is to refer to an output voltage of 1.5–4 V from a first DC power supply.

3. The enhanced CMOS circuit to drive a DC motor according to claim 1, wherein the predetermined control voltage being applied on the gate of the 6 NMOS transistor (13), both in the first and second switching stages (10) (10'), is to refer to an output voltage of 4.5V from a second DC power supply.

4. The enhanced CMOS circuit to drive a DC motor according to claim 1, wherein the predetermined control voltage being applied on one end of the driver stage (20) is to refer to an output voltage of 1.5–4V from a first DC power supply.

5. The enhanced CMOS circuit to drive a DC motor according to claim 1, wherein the first DC power supply being connected to one end of the driver stage (20) is to be derived from battery power (BAT).

6. The enhanced CMOS circuit to drive a DC motor according to claim 2, wherein the first DC power supply being connected to the gate of PMOS transistor (12) of switching stages (10) (10') is to be derived from battery power (BAT).

7. The enhanced CMOS circuit to drive a DC motor according to claim 3, wherein the second DC power supply being connected to the gate of NMOS transistor (13) is to be drawn from system voltage.

8. The enhanced CMOS circuit to drive a DC motor according to claim 1, wherein the higher supply voltage of the positive power supply terminal being connected to one end of the first switching stage (10) is the summation of output voltages of the first DC power supply and the second DC power supply.

9. The enhanced CMOS circuit to drive a DC motor according to claim 1, wherein the higher supply voltage of the positive power supply terminal being connected to one end of the second switching stage (10') is the summation of output voltages of the first DC power supply and the second DC power supply.

* * * * *